United States Patent
Kim

(10) Patent No.: US 6,458,665 B1
(45) Date of Patent: Oct. 1, 2002

(54) HALO ION IMPLANTATION METHOD FOR FABRICATING A SEMICONDUCTOR DEVICE

(75) Inventor: Jae-Hyung Kim, Cheongju (KR)

(73) Assignee: Hyundai Electronics Industries Co., Ltd., Ichon (KR)

( * ) Notice: Subject to any disclaimer, the term of this patent is extended or adjusted under 35 U.S.C. 154(b) by 0 days.

(21) Appl. No.: 09/542,878

(22) Filed: Apr. 4, 2000

(30) Foreign Application Priority Data

May 10, 1999 (KR) .............................. 99-16626

(51) Int. Cl.$^7$ .................................... H01L 21/336
(52) U.S. Cl. ................................. 438/302; 438/525
(58) Field of Search ............................... 438/299, 302, 438/303, 304, 305, 525, 514, 528, 307, 228, 247

(56) References Cited

U.S. PATENT DOCUMENTS

| | | | |
|---|---|---|---|
| 5,320,974 A | * 6/1994 | Hori et al. | 438/302 |
| 5,459,085 A | * 10/1995 | Pasen et al. | 438/302 |
| 5,908,313 A | * 6/1999 | Chau et al. | 438/299 |
| 5,937,293 A | * 8/1999 | Lee | 438/247 |
| 5,970,353 A | * 10/1999 | Sultan | 438/302 |
| 6,005,296 A | * 12/1999 | Chan | 257/904 |
| 6,008,094 A | * 12/1999 | Krivokapic et al. | 438/286 |
| 6,083,794 A | * 7/2000 | Hook et al. | 438/286 |
| 6,194,278 B1 | * 2/2001 | Rengarajan | 438/303 |
| 6,197,632 B1 | * 3/2001 | Bronner et al. | 430/241 |
| 6,198,173 B1 | * 3/2001 | Huang | 257/903 |
| 6,232,166 B1 | * 5/2001 | Ju et al. | 438/231 |
| 6,281,058 B1 | * 8/2001 | Dennison | 438/200 |
| 2001/0051407 A1 | * 12/2001 | Tran | 438/241 |

* cited by examiner

*Primary Examiner*—Savitri Mulpuri
(74) *Attorney, Agent, or Firm*—Fleshner & Kim, LLP

(57) ABSTRACT

The present invention relates to a halo ion implantation method for a semiconductor device, and in a semiconductor device formed of a cell array region with a relatively high concentration of pattern and a peripheral circuit region with a relatively low concentration of pattern. The present invention can improve the data maintenance characteristics by not allowing a source/drain junction in the cell array region to be exposed. In a halo ion implantation method for a semiconductor device of the present invention, a semiconductor substrate having at least one flat zone 31 is prepared, a gate oxide film is formed on the semiconductor substrate, and a plurality of gate electrodes are formed on the gate oxide film. Halo ion implantation is implemented in directions in which a wafer(semiconductor substrate) is horizontally rotated by 45, 135, 225 and 315 degrees at the position of the flat zone when each of the gate electrodes 32a is made arranged in a direction horizontal to the flat zone.

15 Claims, 5 Drawing Sheets

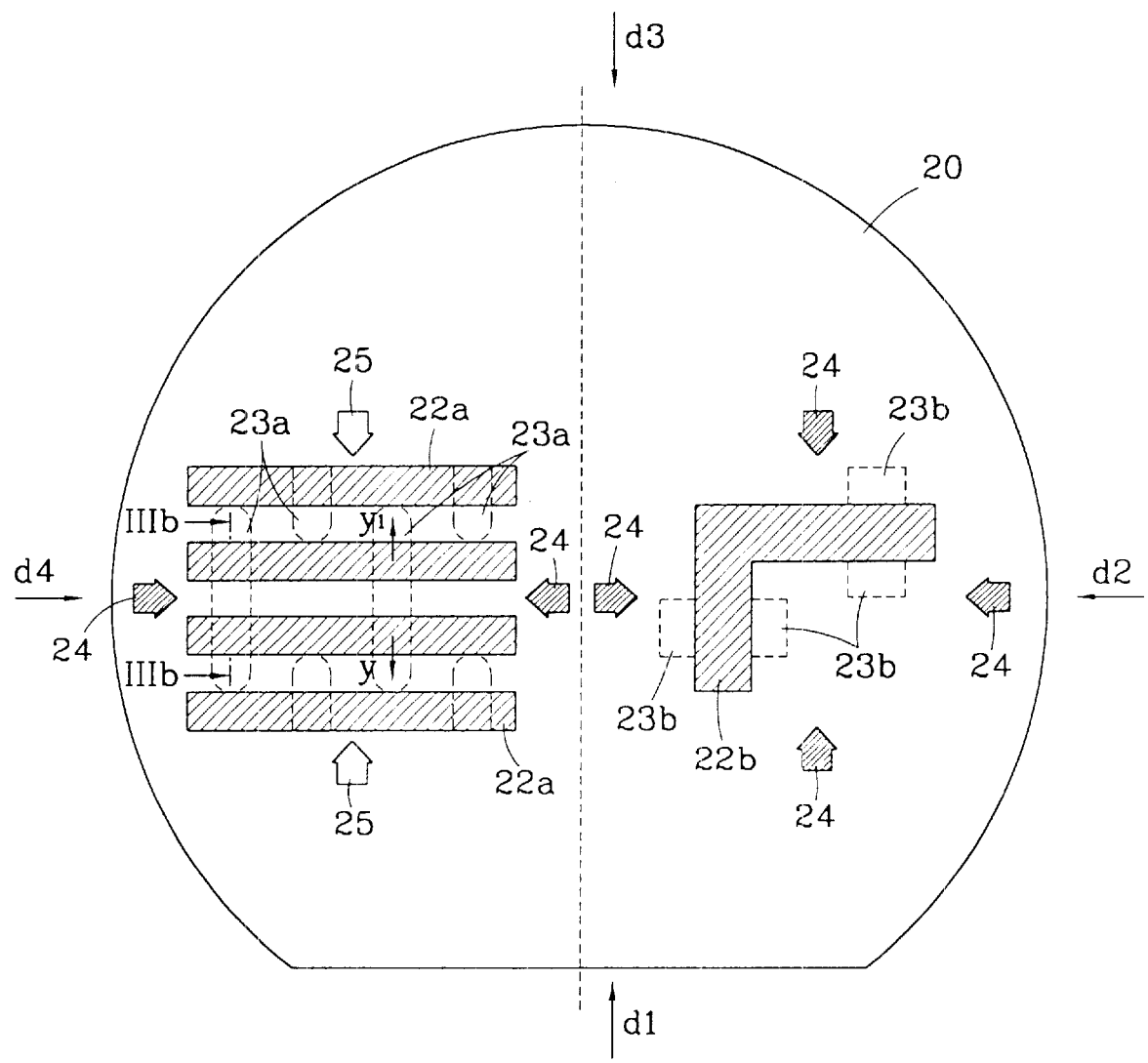

HALO ION IMPLANTATION METHOD FOR FABRICATING A SEMICONDUCTOR DEVICE

BACKGROUND OF THE INVENTION

1. Field of the Invention

The present invention relates to a fabrication method for a semiconductor device, in particular to a halo ion implantation method for a semiconductor device which enhances data maintenance characteristics by not allowing sources/drains of a cell transitor of a Dynamic Random Access Memory(hereinafter DRAM) to be exposed to the halo ion implantation.

2. Description of the Background Art

A halo ion implantation means implanting conductive impurity ions identical with a semiconductor substrate into the semiconductor substrate along the inside sidewalls of sources/drains of a transistor in order to prevent a short channel effect. As a result, the impurity concentration of the semiconductor substrate near the inside sidewalls of the sources/drains becomes higher than that of the semiconductor substrate in other part.

Referring to FIGS. 1a through 1c, a conventional halo ion implantation method will be explained as follows.

A shown in FIG. 1a, a gate oxide film 101 and a gate electrode 102 are formed on a first conductive type(e.g. p-type) semiconductor substrate 100.

Next, using the gate electrode 102 as a mask, a second conductive type(e.g. n-type) impurity ions are implanted into the semiconductor substrate and heat-treated, thus forming an impurity layer 103 with a relatively shallow junction depth as compared with sources/drains which will be explained in the following process step. The second conductive type impurity ions are opposite to the first conductive type impurity ions.

Next, as shown in FIG. 1b, the impurity ions of the same conductive type as that of the semiconductor substrate 100, that is, the first conductive type(p-type) impurity ions are implanted near the sidewalls of the shallow impurity layer 103 below the gate electrode 102, thus forming a halo ion implantation layer 104. At this time, to implant halo ions into a lower side of the gate electrode 102, an ion implantation is carried out at approximately 25~30 degree angle from a direction vertical to the surface of the semiconductor substrate 100. At this time, the incidence angle leaned at 25–30 degrees is called an angle of inclination, and indicated as θ in FIG. 1b.

Generally, in order to form the halo ion implantation layer within the gate electrode 102, impurity ions are implanted at approximately 25–30 degree angle(that is, θ=25~30°) from a vertical direction of the semiconductor substrate.

Next, as shown in FIG. 1 c, a sidewall spacer 105 formed of an insulating film is formed on the sidewalls of the gate electrode 102. Then, by using the sidewall spacer 105 as a mask, a second conductive type impurity ions are implanted into the semiconductor substrate 100 and heat-treated, thus forming a deep impurity layer 106 with a relatively deep junction depth as compared with the shallow impurity layer 103. The deep impurity layer is called a source/drain of a transistor, and the shallow impurity layer is usually called a Lightly Doped Drain(LDD) in a semiconductor fabrication process.

The halo ion implantation process can be explained in detail as follows. In a conventional DRAM device fabrication process, when drawing a layout of a transistor, the layout is arranged in a vertical or horizontal direction from a flat zone of a wafer.

FIG. 2 illustrates an example of a layout of a conventional semiconductor device. Reference numeral 20 represents a wafer and reference numeral 21 is a flat zone. A region 20a with a high concentration of pattern(gate electrode) such as a cell array region of a DRAM device is illustrated on the left side of the dotted line, and a region 20b with a relatively low concentration of pattern as compared with the cell array such as a peripheral circuit region of a DRAM device is illustrated on the right side of the dotted line. Gate electrodes 22a are concentrated on the region 20a with a high concentration of pattern. Reference numeral 23a shown on both sides of the gate electrode 22a represents an impurity region 23a operating as a source/drain of a transistor. Additionally, gate electrode 22b and impurity regions 23b are illustrated on the region 20b with a relatively low concentration of pattern.

Furthermore, arrow 25 in FIG. 2 indicates an ion implantation direction in which the sources/drains 23a and 23b are exposed to the halo ion implantation when the halo ions are implanted. Bold arrow 24 indicates a halo ion implantation direction in which the halo ions are not implanted into the sources/drains 23a.

A detailed description thereof is as follows.

As shown in region 20b with a low concentration of pattern in FIG. 2, for a DRAM device, the pattern of the gate electrode 22b in the peripheral circuit region 20b is at once parallel to the flat zone 21 and arranged in a direction orthogonal to the flat zone 21. Therefore, in order to carry out the halo ion implantation near all the sources/drains 23a of the transistor in the peripheral circuit unit, the halo ion implantation is performed in a direction d1 that the flat zone is positioned, and in a direction d2 that the wafer is rotated 90 degrees, 180 degrees, and 270 degrees from the flat zone 21, respectively. Thus, the halo ion implantation is carried out in the cell region 20a as well in four directions d1, d2, d3, and d4. However, as the degree of integration of the DRAM device goes up, the space between the patterns(gate electrodes) becomes very narrow, so that in the case the halo ion implantation is carried out in directions d1 and d3, the halo ions are almost not implanted into the sources/drains 23a. However, in the case that the halo ions are implanted in directions d2 and d4(longitudinal directions of the gate electrode 22a in the cell array region), the sources/drains 23a are directly exposed to the halo ion implantation.

To give more, as shown in FIG. 3a, in the case that the halo ions are implanted in direction 25(that is, directions d1 and d3), the gate electrode 22a serves as an ion implantation mask. But, in the case of direction 24(directions d2 and d4), there is no halo ion cut-off mask, and thus the halo ions are directly implanted into the sources/drains 23a Since FIG. 3a is a vertical cross-sectional perspective view along the line IIIb—IIIb of FIG. 2 and FIG. 3b is a vertical cross-sectional view along the line IIIb—IIIb of FIG. 2, the identical drawing symbols in FIGS. 2, 3b, and 3b denote the same component parts, respectively.

However, recently as the degree of integration of the DRAM increases by geometric progression recently, the size of a cell becomes smaller, resulting in a decrease in the capacity of a capacitor. For the above reason, the halo ions implanted into the sources/drains of a DRAM cell transistor cause a reverse effect of worsening the data maintenance characteristics.

That is, since a halo ion implantation layer has a high concentration of impurity, the source/drain junction forms more abrupt junction compared with the case of not applying halo ion implantation process, resulting in stronger electric field concentration at the source/drain junction where the halo ion implantation is implemented. In addition, the DRAM cell is comprised of a transistor and a capacitor, and if the electric field of a source or drain junction connected to a node electrode of the capacitor increases, the data maintenance time shortens, resulting in a decrease in the refresh characteristics. Therefore, to improve the data maintenance characteristics within the DRAM cell, the halo ion implantation process needs to be applied not to the DRAM cell transistor, but to a peripheral circuit or a core circuit alone.

Accordingly, in order to carry out the halo ion implantation into a peripheral circuit and a core circuit alone within the DRAM device and to prevent the halo ion implantation into a cell transistor, the halo ion implantation may be implemented by forming an ion implantation mask on the DRAM cell. However, such a method requires a photolithography process and then, an ion implantation mask removal and cleaning processes thereof, making the halo ion implantation process complicated, increasing the livelihood of a damaged and contaminated semiconductor substrate, and thereby having a poor reliability of the semiconductor substrate.

SUMMARY OF THE INVENTION

Accordingly, the present invention is devised to solve the conventional arts problems, and it is an object of the present invention to provide a halo ion implantation method for improving the data maintenance and refresh characteristics of a DRAM device without any extra process steps such as a photolithography process and a cleaning process.

The present invention, in a semiconductor device having a part with a high concentration of gate electrode pattern such as a cell array and a part with a low concentration of gate electrode pattern such as a peripheral circuit, has another object of providing a halo ion implantation method for a semiconductor device for implanting halo ions only into the sources/drains in the part with a low concentration of pattern and not implanting the halo ions into the part with a high concentration of pattern, without any extra mask forming process steps.

To achieve the objects of the present invention, there is provided a halo ion implantation method for a semiconductor device comprising a process for forming a plurality of gate electrodes in a cell array region on a semiconductor substrate so as to be arranged in parallel in one-way and a process for implanting the halo ions within the range of 25° to 30° vertical angle of inclination at an angle where a wafer is rotated horizontally within the range of 25°~65° in a clockwise direction or in a counterclockwise direction from a direction orthogonal to a longitudinal direction of the gate electrodes.

To achieve the objects of the present invention, there is provided a halo ion implantation method for a semiconductor, wherein when the gate electrodes of a DRAM cell transistor are arranged in a direction horizontal or vertical to a flat zone, ion implantation is implemented in a direction that a wafer is rotated by $\phi$ ($\phi$ is between 25°~65°) from a direction orthogonal to the flat zone.

Also, to achieve the objects of the present invention, in a semiconductor device having a region with a relatively low concentration of gate electrode and a region with a relatively high concentration of gate electrode, in order to implant the halo ions only into the region with a relatively low concentration of gate electrode, there is provided a halo ion implantation method for a semiconductor device, wherein the halo ion implantation is implemented in a direction of 45°±20° from a direction orthogonal to a longitudinal direction of the gate electrodes in the region with a high concentration of gate electrode.

In addition, to achieve the objects of the present invention, in a semiconductor device having a region with a relatively low concentration of gate electrode and a region with a relatively high concentration of gate electrode, in order to implant the halo ions only into the region with a relatively low concentration of gate electrode, there is provided a halo ion implantation method for a semiconductor device, wherein $\phi$ is a horizontal angle of rotation at which a wafer is rotated in a clockwise direction or in a counterclockwise direction from a direction orthogonal to a longitudinal direction of the gate electrodes formed on the region with a relatively high concentration of gate electrode, $\theta$ is a vertical angle of inclination of incident ions from a direction vertical to the surface of the wafer, h is the height of gate electrodes of a large number of transistors forming a cell array of a DRAM device, s is the length of a space between the gate electrodes, and the halo ions are implanted within a range satisfying $|\tan\phi \times \cos\theta| > s/h$.

Particularly, there is preferably provided a halo ion implantation method for a semiconductor device, wherein ($\varphi$, a horizontal angle of rotation of the wafer is 45°, 135°, 22° and 315°, and $\theta$, a vertical angle of inclination is from 25° to 30°.

BRIEF DESCRIPTION OF THE DRAWINGS

FIG. 2 is a schematic view of a semiconductor substrate for describing a halo ion implantation direction of a conventional semiconductor device.

DETAILED DESCRIPTION OF THE PREFERRED EMBODIMENTS

Figure 1A:
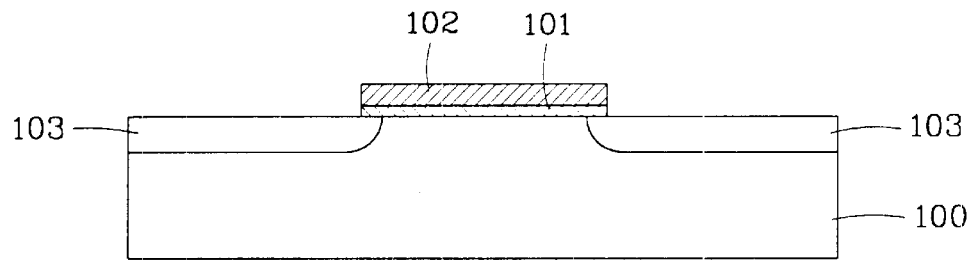
FIGS. 1a to 1c are vertical cross-sectional views of a semiconductor device for describing a conventional halo ion implantation method.
Figure 1B:
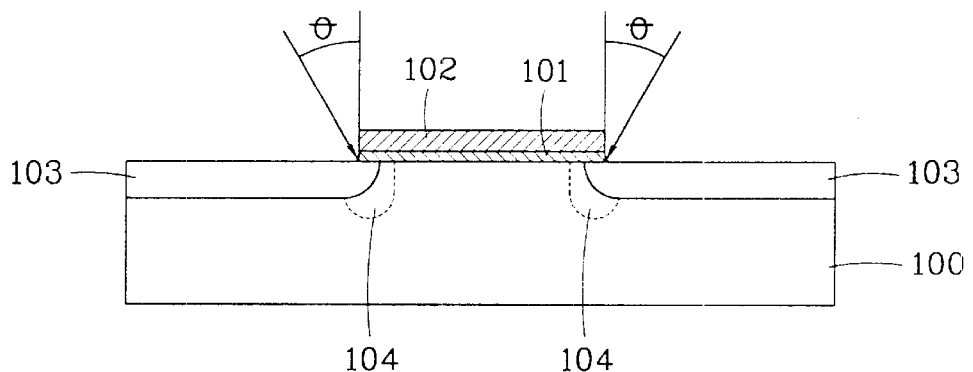
Figure 1C:
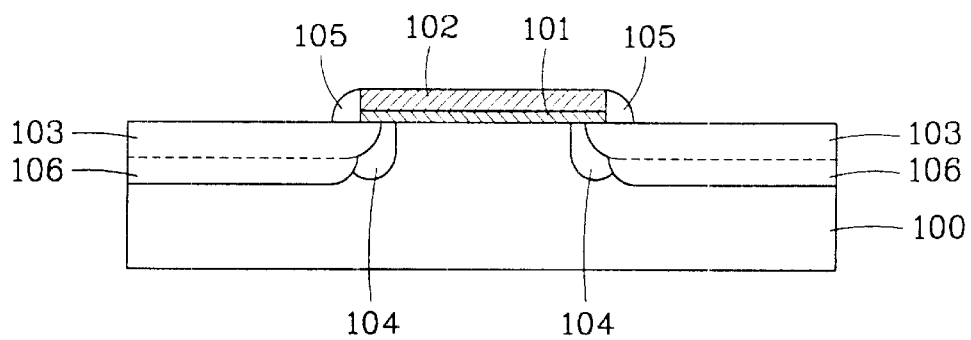
Figure 3A:
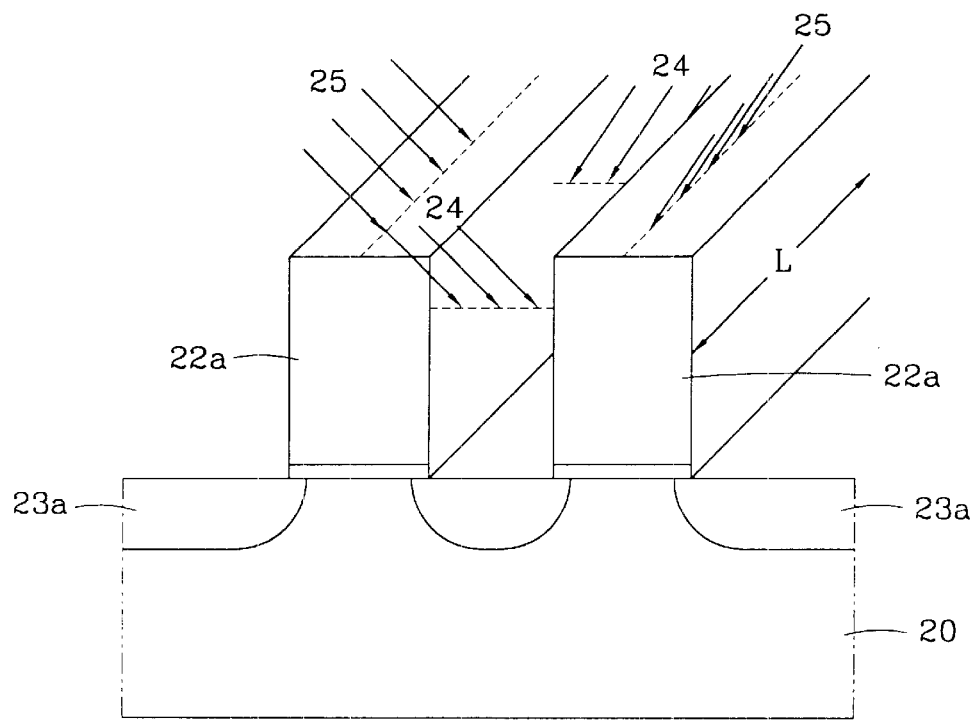
FIG. 3a is a vertical cross-sectional perspective view along the line IIIb—IIIb of FIG. 2.
Figure 3B:
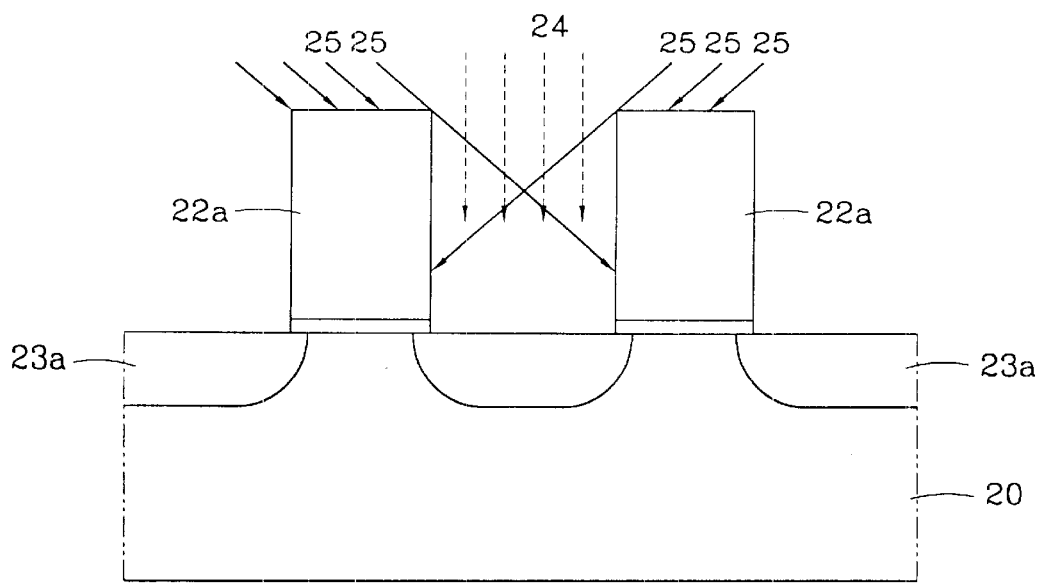
FIG. 3b is a vertical cross-sectional view along the line IIIb—IIIb of FIG. 2.

The first embodiment of the present invention will be described below referring to FIG. 4.

First, a wafer 30 having at least one flat zone 31 is prepared. The wafer 30 can be divided into a cell array region 30a with a high concentration of pattern and a peripheral circuit region 30b with a low concentration of pattern. In FIG. 4, the left side of a dotted line is designated as a cell array region 30a and the right side of the dotted line is designated as a peripheral circuit region 30b for the convenience of description.

Next, a gate oxide film(not shown) is formed on the wafer 30 and the gate electrodes 32a of a memory cell transistor and gate electrodes 32b of the transistor in a peripheral circuit unit are formed on the gate oxide film(not shown). The gate electrodes 32a and 32b are formed by a generally well-known method.

Also, each of the gate electrodes 32a and 32b is formed so that it may be arranged in a direction parallel or orthogonal to the flat zone 31. In more detail, while the gate electrodes 32a of the memory cell transistor are arranged parallel to the flat zone 31, the gate electrodes 32b of the peripheral circuit transistor are arranged in a direction parallel to the flat zone 31 and in a direction orthogonal to the flat zone 31.

Reference numerals 33a, 33b, 33c and 33d denote the regions where the source/drain of each transistor is formed Next, first halo ion implantation is implemented after the wafer is rotated by φ, a horizontal angle of rotation, in a one-way, for example, in a clockwise direction or in a counterclockwise direction from a direction orthogonal to a longitudinal direction L(for example, a direction in which the signals of the gate electrodes are transferred) of the gate electrodes 32a, that is, from a direction in which the channel of a transistor is formed. The directions in which the wafer is rotated by φ, a horizontal angle of rotation, in a clockwise direction from a direction y—y in which the channel is formed are denoted by d1' or d3'. At this time, d1' and d3' are directions corresponding to each other, that is, directions being rotated by 180 degrees.

Next, the directions in which the wafer is horizontally rotated by φ, a horizontal angle of rotation, in a counterclockwise direction from a direction y—y in which the channel is formed are denoted by d2' and d4', which are also directions corresponding to each other.

When halo ions are implanted, a vertical angle of incidence(or an angle of inclination) of the halo ions being incident upon the surface of the wafer is denoted by θ, which is preferably from 25 degrees to 30 degrees.

After the first halo ion implantation is performed from one of the directions d1, d2, d3 and d4, second, third and fourth halo ion implantations are sequentially implemented from the other directions by rotating the wafer.

At this time, the horizontal angle of rotation, φ, is preferably within the range of 45+25°. This is because when the halo ions are implanted in a direction P(that is, a longitudinal direction of the gate electrodes) shown in FIG. 4, the halo ions are implanted into the sources/drains 33a within a cell array. The halo ions need to be implanted in a direction diagonal to the gate electrodes to prevent the halo ions from being implanted in the direction P.

If the horizontal angle of rotation, φ, is 45°, when the first halo ions are implanted in d1' which is a direction being rotated by φ in a clockwise direction from the flat zone 31, the halo ions are implanted into the sources/drains 33b in a peripheral circuit unit. In addition, when the second halo ion implantation is implanted in direction d2' which is 135° from the flat zone 31 by further rotating the wafer by 90 degrees from d1', the halo ions are implanted into the sources/drain 33c. Next, when the third halo ion implantation is implemented in d3' which is 225° from the flat zone 31 and in d4' which is 315° from the flat zone 31 by rotating the wafer, the halo ions are implanted into the sources/drain 33d.

That is, although the halo ion implantation is implemented in any one of the directions d1', d2', d3' and d4', the halo ions are not implanted into the sources/drains 33a. By not implanting halo ions in a longitudinal direction of the gate electrodes 32a within the cell array and in a direction orthogonal thereto, but in a diagonal direction thereto, the gate electrodes serve as a mask and thereby prevents the halo ions from being implanted into the sources/drains 33a within the cell array.

Figure 4:
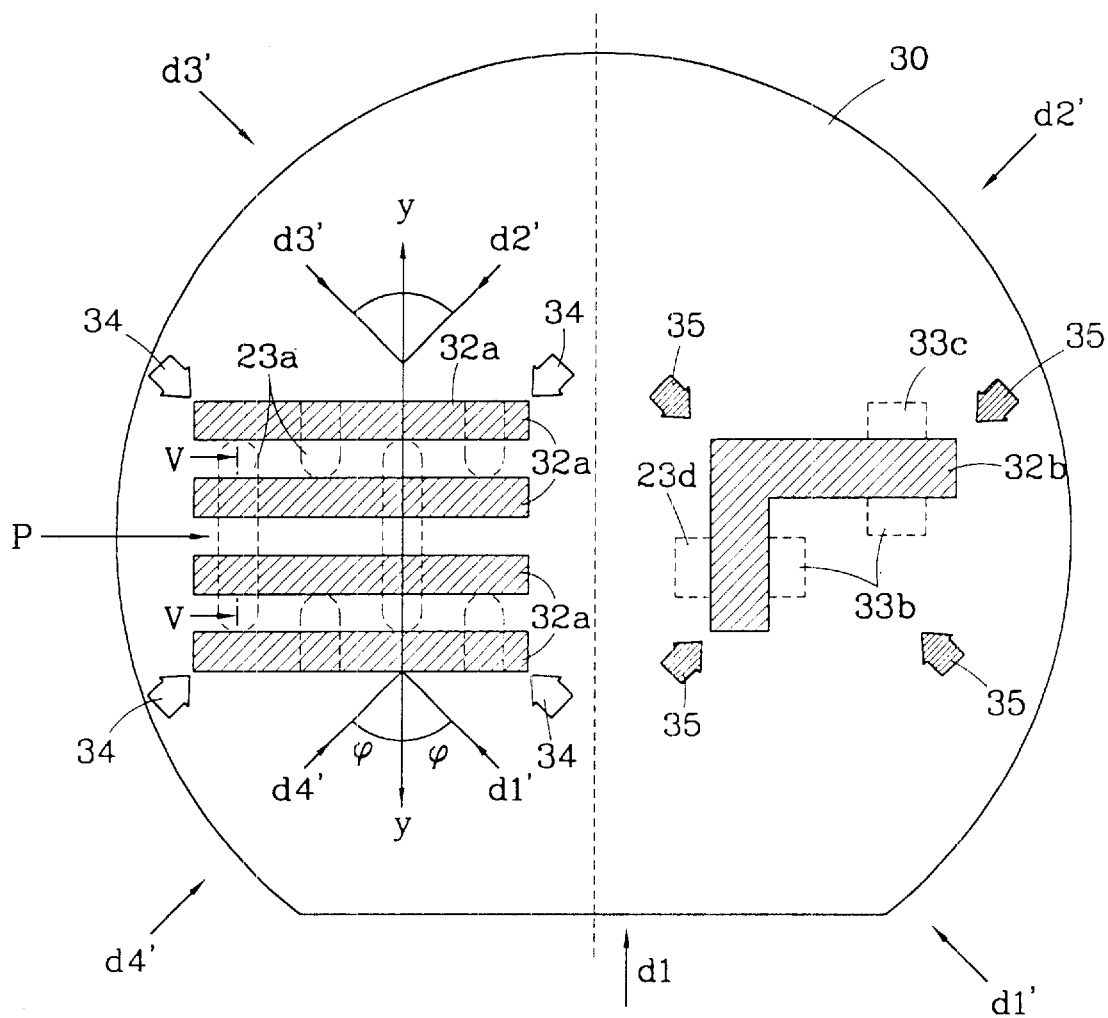
FIG. 4 is a schematic view of a semiconductor substrate for describing a halo ion implantation direction of the present invention.

In FIG. 4, arrow 34 indicates an ion implantation direction in which the halo ions are not implanted into the sources/drains, and bold arrow 35 indicates an ion implantation direction in which the halo ions are implanted into sources/drains.

Figure 5:
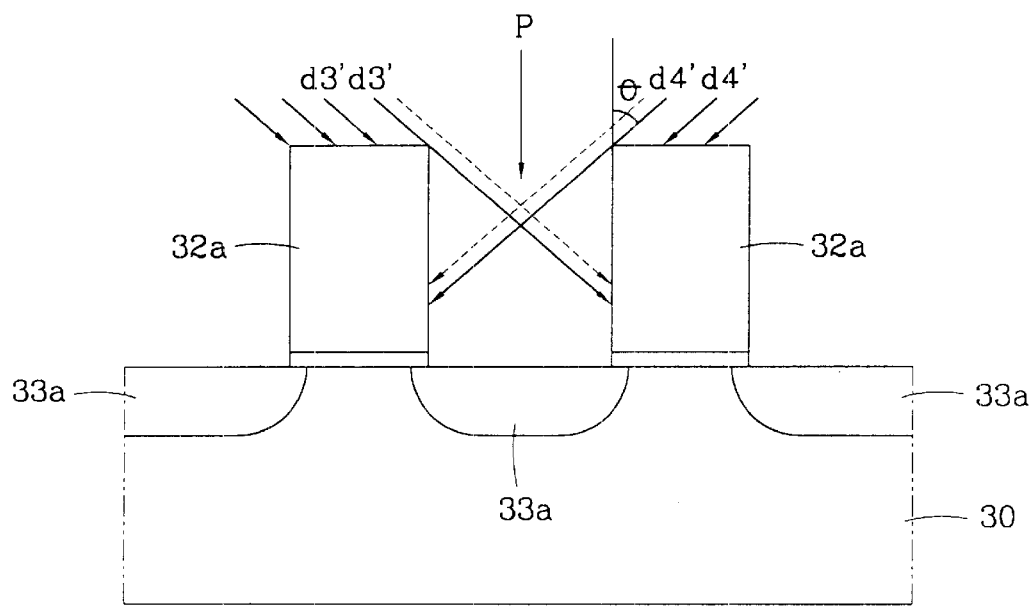
FIG. 5 is a vertical cross-sectional view along the line V—V of FIG. 4.

FIG. 5 is a vertical cross-sectional view along the line V—V, in which the parts identical with the drawing symbols of FIG. 4 denote the same component parts as those of FIG. 4. As shown in FIG. 5, gate electrodes 32a serve as a mask during halo ion implantation.

The operating principle of the present invention is to prevent the sources/drains of a transistor within a DRAM cell array from being exposed to the halo ion implantation by adjusting a direction of the halo ion implantation in the halo ion implantation process step. As a result, not requiring an extra mask pattern, the halo ions are implanted not into the cell array but into a peripheral circuit and a core circuit alone, thereby improving the data maintenance characteristics of a memory cell and maintaining the tolerance to a punch-through of the peripheral circuit at the same time.

Figure 6:
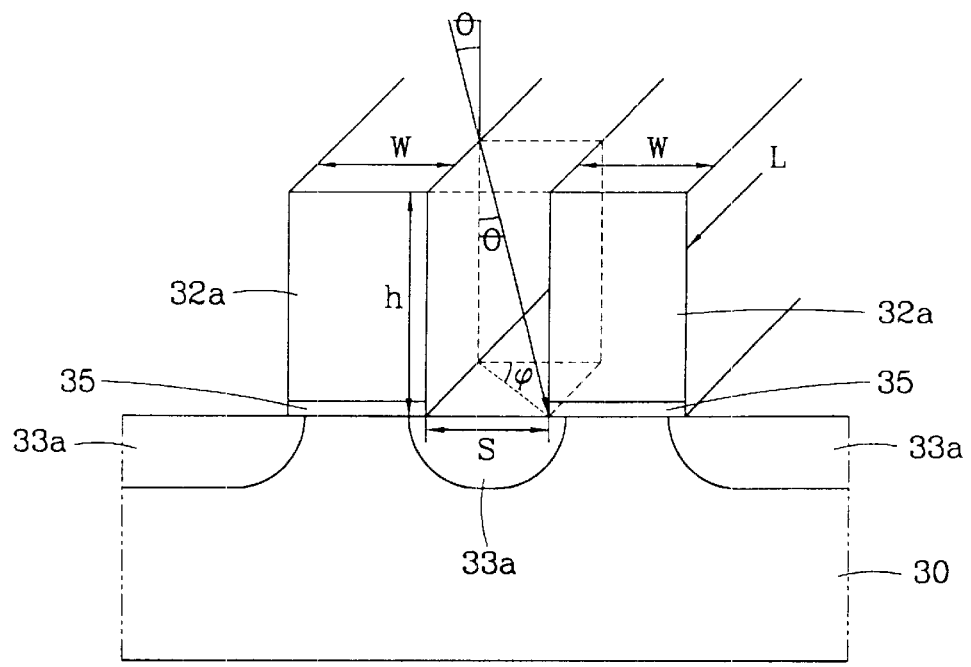
FIG. 6 is a vertical cross-sectional view of a semiconductor device for describing the operating principle of the present invention.

FIG. 6 illustrates a vertical cross-sectional view along the line V—V. A gate oxide film 35 is formed on the upper side of a semiconductor substrate 30, and gate electrodes 32a are formed on the upper side of the gate oxide film 35. The height of the gate electrode 32a is denoted by h. In general, an insulation cap layer(not shown in FIG. 6) is usually formed on the upper side of the gate electrode when fabricating a semiconductor device, and herein h is the height including the height of the insulation cap layer. Sources/drains 33a are formed within the semiconductor substrate between the gate electrode 32a and the gate electrode 32a adjacent thereto. The clearance between the gate electrode 32a and the gate electrode 32a adjacent thereto is denoted by s. The incident angle upon which ions are incident during the halo ion implantation(the angle of inclination which slopes from a direction vertical to the surface of a wafer) is denoted by θ. Furthermore, the angle of inclination in a horizontal direction upon which the halo ions are incident from a width W direction of the gate electrode 32a, that is, the direction in which the channel of a transistor is formed is denoted by φ. Herein, the angle of inclination in a horizontal direction is the same as the horizontal angle of rotation, φ, in FIG. 4.

At this time, when h, s, φ, and θ are expressed by the following equation, the halo ions are not implanted into the sources/drains 33a of the cell array.

$$\tan\theta \cdot \cos\phi| > s/h \qquad \text{[equation]}$$

By not allowing source/drain junctions of a cell transistor exposed to the halo ion implantation without carrying out any extra photography process, the data maintenance and refresh characteristics of the cell transistor are improved and a punch-through of a peripheral circuit transistor is prevented at the same time, thereby improving the reliability of a semiconductor device.

What is claimed is:

1. A halo ion implantation method for a semiconductor device, comprising:

preparing a semiconductor substrate having at least one flat zone and doped with an impurity so as to fabricate a semiconductor device with a cell array region and a peripheral circuit region;

forming a gate oxide film on the semiconductor substrate;

forming a plurality of gate electrodes on the gate oxide film in the cell array region so that each of the gate electrodes is arranged in parallel in a direction horizontal or vertical to the flat zone; and implanting halo ions into the semiconductor substrate using each of the gate electrodes as a mask, wherein the halo ion implantation occurs within predetermined angle ranges for θ and φ, where the absolute value of the product of the tangent of θ and the cosine of φ is greater than the ratio of s divided by h, wherein s is a clearance between the gate electrodes formed in the cell array region, h is the height of a gate electrode, φ is the horizontal angle in a direction in which impurity ions are incident from a direction orthogonal to a longitudinal direction of a gate electrode, and θ is the vertical angle in a direction in which impurity ions are incident from a direction vertical to the surface of the semiconductor substrate to prevent halo ion implantation in the cell array region.

2. The method of claim 1, wherein the longitudinal direction of a gate electrode is in a direction parallel to the flat zone.

3. The method of claim 2, wherein φ is 45 degrees.

4. The method of claim 2, wherein φ is between 20°~70°.

5. The method of claim 2, wherein the halo ion implantation process is a process in which a first halo ion implantation is implemented after rotating a wafer by 45 degrees in a clockwise direction from a direction in which the flat zone is positioned, a second halo ion implantation is implemented in a direction in which the wafer is rotated by 135 degrees from a direction in which the flat zone is positioned, a third halo ion implantation is implemented in a direction in which the wafer is rotated by 225 degrees from a direction in which the flat zone is positioned, and then a fourth halo ion implantation is implemented in a direction in which the wafer is rotated by 315 degrees.

6. The method of claim 5, wherein the halo ion implantation is implemented at an angle of inclination of about 25~30 degrees from a direction vertical to the surface of the semiconductor substrate.

7. A halo ion implementation method for a semiconductor substrate, wherein, in fabricating a semiconductor device having a region with a relatively low concentration of gate electrode and a region with a relatively high concentration of gate electrode, a halo ion implantation is implemented in a direction horizontally migrated by 25~65° from a direction orthogonal to a longitudinal direction of the gate electrodes in the region with the high concentration of gate electrode so as to implant halo ions only into the region with the relatively low concentration of gate electrode wherein the halo ion implantation is implemented within predetermined angle ranges for θ and φ where the absolute value of the product of the tangent of θ and the cosine of φ is greater than the ratio of s divided by h, wherein a horizontal angle of rotation horizontally migrated in a clockwise or counter clockwise direction from a direction orthogonal to a longitudinal direction of the gate electrodes formed in the region with the relatively high concentration of gate electrode is φ, a vertical angle of inclination of incident ions from a direction vertical to a surface of a wafer is θ, a height of a gate electrode is h, and s is clearance between the gate electrode and an adjacent gate electrode.

8. A method to selectively implant ions into a surface of a semiconductor substrate, comprising:

forming parallel rows of first gate electrodes in a first region of the semiconductor substrate;

forming second gate electrodes in a second region of the semiconductor substrate, wherein a first portion of said second gate electrodes are parallel to a first direction and a second portion of said second gate electrodes are perpendicular to the first direction; and implanting ions into the surface of the semiconductor substrate at a rotation angle relative to the first direction and at an incidence angle relative to a second direction such that said first gate electrodes mask the surface of the semiconductor substrate between said parallel rows of first gate electrodes from the implanting ions to prevent implanting ions into the first region of the semiconductor substrate wherein the rotation angle and the incident angle are defined by the relationship where θ is the incident angle, φ is the rotation angle, s is the clearance between row of the first gate electrodes, and h is the height of.

9. The method of claim 8, wherein the parallel rows of first gate electrodes are parallel to said first direction.

10. The method of claim 8, wherein the second direction is orthogonal to the first direction.

11. The method of claim 8, further comprising forming said first gate electrodes at a first density in the first region and forming said second gate electrodes at a second density in the second region, wherein said first density is denser than said second density.

12. The method of claim 8, wherein the rotation angle comprises an angle between approximately 20° and 70°.

13. The method of claim 8, wherein the incidence angle comprises an angle between approximately 25° and 30°.

14. The method of claim 8, wherein the rotation angle comprises a first rotation angle, a second rotation angle, a third rotation angle, and a fourth rotation angle, wherein the first rotation angle is approximately between 20° and 70°, the second rotation angle is approximately 180° from the first rotation angle, the third rotation angle is approximately 90° from the second rotation angle, and the fourth rotation angle is approximately 180° from the third rotation angle.

15. The method of claim 14, wherein the first rotation angle is approximately 45°, the second rotation angle is approximately 135°, the third rotation angle is approximately 225°, and the fourth rotation angle is approximately 315°.

* * * * *